(12) United States Patent
Fukushima

(10) Patent No.: US 11,273,497 B2
(45) Date of Patent: Mar. 15, 2022

(54) COATED CUTTING TOOL

(71) Applicant: TUNGALOY CORPORATION, Fukushima (JP)

(72) Inventor: Naoyuki Fukushima, Iwaki (JP)

(73) Assignee: TUNGALOY CORPORATION, Iwaki (JP)

( * ) Notice: Subject to any disclaimer, the term of this patent is extended or adjusted under 35 U.S.C. 154(b) by 166 days.

(21) Appl. No.: 16/705,586

(22) Filed: Dec. 6, 2019

(65) Prior Publication Data

US 2020/0230706 A1 Jul. 23, 2020

(30) Foreign Application Priority Data

Jan. 18, 2019 (JP) .............................. JP2019-006932

(51) Int. Cl.
*B23B 27/14* (2006.01)
*C23C 28/04* (2006.01)
(Continued)

(52) U.S. Cl.
CPC .............. *B23B 27/148* (2013.01); *B23C 5/16* (2013.01); *C23C 16/36* (2013.01); *C23C 16/403* (2013.01);
(Continued)

(58) Field of Classification Search
CPC . B23B 27/14; B23B 27/148; B23B 2228/105; C23C 16/308; C23C 16/32;
(Continued)

(56) References Cited

U.S. PATENT DOCUMENTS 4,357,382 A * 11/1982 Lambert ............... C23C 30/005
428/698
5,871,850 A 2/1999 Moriguchi et al.
(Continued)

FOREIGN PATENT DOCUMENTS

EP 3 000 913 A1 3/2016
JP H08-158052 A 6/1996
(Continued)

OTHER PUBLICATIONS

A. Larsson, S. Ruppi; "Microstructure and properties of Ti(C,N) coatings produced by moderate temperature chemical vapour deposition"; Thin Solid Films, vol. 402; Jan. 2002; pp. 203-210; Elsevier; ISSN: 0040-6090.
(Continued)

*Primary Examiner* — Archene A Turner
(74) *Attorney, Agent, or Firm* — Studebaker & Brackett PC

(57) ABSTRACT

A coated cutting tool comprising: a substrate; and a coating layer formed on a surface of the substrate, wherein: the coating layer comprises a lower layer, an intermediate layer and an upper layer in this order from the substrate side; the lower layer comprises one or more Ti compound layers containing a Ti compound of Ti and an element of at least one kind selected from the group consisting of C, N, O and B; and the intermediate layer comprises an $\alpha$-$Al_2O_3$ layer containing $\alpha$-$Al_2O_3$; and the upper layer comprises a TiCN layer containing TiCN; an average thickness of the coating layer is within a specific range, and an average thickness of the upper layer is within a specific range; in a cross section perpendicular to the surface of the substrate, the grains in the TiCN layer constituting the upper layer satisfies a specific condition.

20 Claims, 1 Drawing Sheet

(51) Int. Cl.
*C23C 16/36* (2006.01)
*C23C 16/40* (2006.01)
*B23C 5/16* (2006.01)

(52) U.S. Cl.
CPC .......... *C23C 28/042* (2013.01); *C23C 28/044* (2013.01); *B23B 2224/32* (2013.01); *B23B 2228/04* (2013.01); *B23B 2228/105* (2013.01)

(58) Field of Classification Search
CPC ....... C23C 16/34; C23C 16/36; C23C 16/403; C23C 16/044
USPC ........................................................ 428/698
See application file for complete search history.

(56) References Cited

U.S. PATENT DOCUMENTS

| | | | | |
|---|---|---|---|---|
| 10,974,324 | B2* | 4/2021 | Takahashi | B23B 27/148 |
| 2003/0022029 | A1 | 1/2003 | Kidama et al. | |
| 2004/0202877 | A1* | 10/2004 | Martensson | C04B 41/89 |
| | | | | 428/698 |
| 2017/0275765 | A1 | 9/2017 | Stiens et al. | |
| 2017/0342554 | A1* | 11/2017 | Bjormander | C23C 28/048 |

FOREIGN PATENT DOCUMENTS

| | | | |
|---|---|---|---|
| JP | 2001-107237 A | | 4/2001 |
| JP | 2002-346811 | * | 12/2002 |
| JP | 2009-056538 A | | 3/2009 |
| JP | 2012-196726 A | | 10/2012 |
| JP | 2017530019 A | | 10/2017 |

OTHER PUBLICATIONS

Michael Tkadletz et al.; "Advanced characterization methods for wear resistant hard coatings: A review on recent progress"; Surface and Coatings Technology, vol. 285; Nov. 14, 2015; pp. 31-46; Elsevier; ISSN: 0257-8972.

"Advances in Cutting Tool and Coating Technology", Vuoriteollisuus-Bergshanteringen, Mar. 2002, pp. 25-33.

Ruppi, "Enhanced performance of α—Al2O3 coatings by control of crystal orientation", Surface & Coating Technology vol. 202, Issue 17, May 2008, pp. 4257-4269, http://doi.org/10.1016/j.surfcoat.2008.03.021.

Bonetti et al., "CVD of Titanium Carbonitride at Moderate Temperature: Properties and Applications", Metal Powder Report, Dec. 1990, pp. 837-840.

* cited by examiner

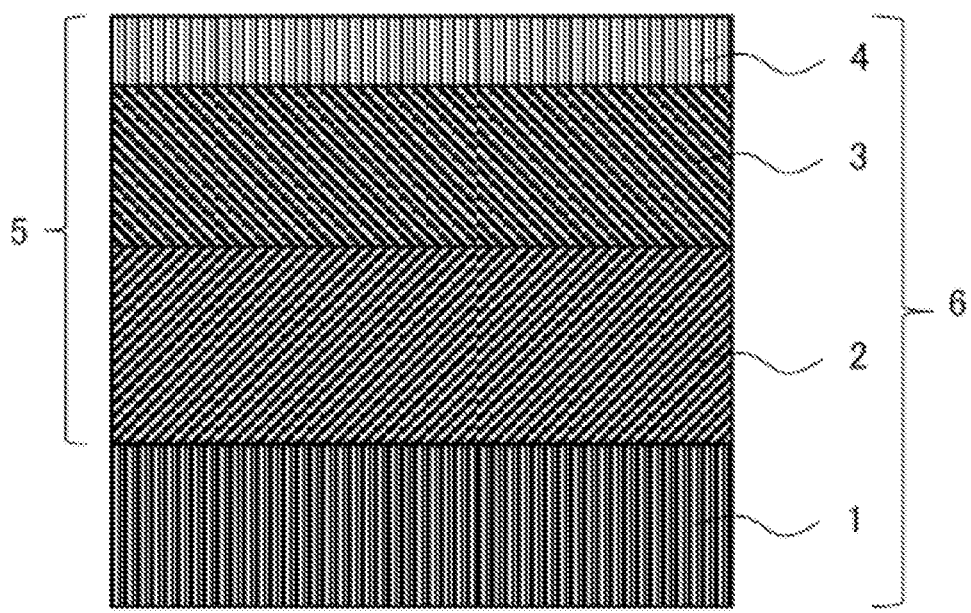

COATED CUTTING TOOL

TECHNICAL FIELD

The present invention relates to a coated cutting tool.

BACKGROUND ART

It is well known that a conventional coated cutting tool used for the cutting of steel, cast iron, etc., is a coated cutting tool which is obtained by depositing, via chemical vapor deposition, a coating layer with a total thickness of from 3 μm or more to 20 μm or less on a surface of a substrate consisting of a cemented carbide. A known example of the above coating layer is a coating layer consisting of a single layer of one kind selected from the group consisting of a Ti carbide, a Ti nitride, a Ti carbonitride, a Ti carboxide, a Ti oxycarbonitride, and aluminum oxide, or consisting of multiple layers of two or more kinds selected therefrom.

For example, JP2017-530019 T discloses a coated cutting tool consisting of a substrate of a cemented carbide, a cermet, a ceramic, steel, or cubic boron nitride, and a multi-layered wear resistant coating having a total coating thickness of from 5 μm or more to 25 μm or less and comprising at least two refractory coating layers deposited by chemical vapor deposition (CVD) or moderate temperature chemical vapor deposition (MT-CVD), the at least two refractory coating layers including a first coating layer and a second coating layer being deposited on top of each other, wherein the first coating layer consists of titanium aluminum nitride or titanium aluminum carbonitride $Ti_{1-u}Al_uC_vN_w$, with $0.2 \leq u \leq 1.0$, $0 \leq v \leq 0.25$, and $0.7 \leq w \leq 1.15$, and is deposited by CVD at a reaction temperature within the range of 600° C. to 900° C., the second coating layer consists of titanium carbonitride $Ti_xC_yNi_{1-y}$, with $0.85 \leq x \leq 1.1$ and $0.4 \leq y \leq 0.85$, and is deposited on the first coating layer by MT-CVD at a reaction temperature within the range of 600° C. to 900° C., wherein the second $Ti_xC_yNi_{1-y}$ coating layer has a columnar grain morphology and the overall fiber texture of the $Ti_xC_yNi_{1-y}$ coating layer is characterized by a texture coefficient TC (111)>2 where TC (111) is defined as follows: . . . (in the formula, (hkl)=measured intensity of the (hkl) reflection; $I_0$(hkl)=standard intensity of the standard powder diffraction data according to JCPDF-card No. 42-1489; n=number of reflections used in the calculation; for the (hkl) reflections, (111), (200), (220), and 311 are used).

SUMMARY

Technical Problem

An increase in speed, feed and depth of cut has become more conspicuous in cutting in recent times, and the wear resistance of a tool and the fracture resistance thereof are required to be further improved compared to those involved in the prior art. In particular, in recent years, there has been an increase in the number of cutting operations in which a load is applied to a coated cutting tool, such as high-speed cutting of steel, and under such severe cutting conditions, crater wear and fracture occur in the conventional tools due to falling of grains of the coating layer, which makes it impossible to extend the tool life.

Since the coated cutting tool disclosed in JP2017-530019 T does not include an $\alpha$-$Al_2O_3$ layer, the crater wear resistance is insufficient. Further, in general, when a TiCN layer is formed as the top layer on the $\alpha$-$Al_2O_3$ layer in the coating layer of the coated cutting tool, the structure of the TiCN layer is granular because $CH_4$ gas is used as a carbon source. For this reason, it is difficult to control the orientation in the TiCN layer, and fracture due to falling of grains of the TiCN layer of the upper layer occurs, so that it is difficult to form a thick TiCN layer.

The present invention has been made in light of the above circumstances, and an object of the present invention is to provide a coated cutting tool which has excellent wear resistance and fracture resistance and which accordingly allows for an extended tool life.

Solution to Problem

The present inventor has conducted research on extending the tool life of a coated cutting tool from the above perspective and has found that with a configuration in which a coating layer includes a lower layer having one or more Ti compound layers, an intermediate layer having an $\alpha$-$Al_2O_3$ layer, and an upper layer having a TiCN layer in this order, and in which the upper layer having specific TiCN grains with controlled aspect ratio and misorientation of the (111) orientation in a specific ratio has a specific thickness on the surface of the intermediate layer having an $\alpha$-$Al_2O_3$ layer, it is possible to suppress the falling of grains of the TiCN layer of the upper layer, thereby making it possible to improve the wear resistance and fracture resistance, so that the tool life of the cutting tool can be extended. The present invention has been accomplished based on this finding.

That is, the gist of the present invention is as follows.

[1] A coated cutting tool comprising: a substrate; and a coating layer formed on a surface of the substrate, wherein:

the coating layer comprises a lower layer, an intermediate layer, and an upper layer in this order from the substrate side;

the lower layer comprises one or more Ti compound layers containing a Ti compound of Ti and an element of at least one kind selected from the group consisting of C, N, O and B; and the intermediate layer comprises an $\alpha$-$Al_2O_3$ layer containing $\alpha$-$Al_2O_3$, and the upper layer comprises a TiCN layer containing TiCN;

an average thickness of the coating layer is 5.0 μm or more and 30.0 μm or less, and an average thickness of the upper layer is 1.0 μm or more and 6.0 μm or less;

in a cross section perpendicular to the surface of the substrate, a ratio of grains having an aspect ratio of 2 or more and 10 or less among the grains in the TiCN layer constituting the upper layer is 60 area % or more and 95 area % or less; and in the grains having an aspect ratio of 2 or more and 10 or less among the grains in the TiCN layer constituting the upper layer, a misorientation A satisfies a condition represented by a following formula (1):

$$40 \leq RSA_1 \leq 90 \tag{1}$$

in the formula, $RSA_1$ is a ratio (unit: area %) of a cross-sectional area of grains having a misorientation A of 0 degrees or more and less than 10 degrees to a cross-sectional area of grains having a misorientation A of 0 degrees or more and 45 degrees or less, and the misorientation A is an angle (unit: degree) formed by a normal to the surface of the substrate and a normal to a (111) orientation of the grain of the TiCN layer in the upper layer.

[2] The coated cutting tool according to [1], wherein the $RSA_1$ is 60 area % or more and 90 area % or less.

[3] The coated cutting tool according to [1] or [2], wherein where a ratio of a cross-sectional area of grains having a misorientation A of 0 degrees or more and less than 10 degrees, a ratio of a cross-sectional area of grains having a misorientation A of 10 degree or more and less than 20 degrees, a ratio of a cross-sectional area of grains having a misorientation A of 20 degree or more and less than 30 degrees, and a ratio of a cross-sectional area of grains having a misorientation A of 30 degree or more and 45 degrees or less to the cross-sectional area of grains having a misorientation A of 0 degrees or more and 45 degrees or less is denoted by $RSA_1$, $RSA_2$, $RSA_3$, and $RSA_4$, respectively, the $RSA_1$ is the largest and the $RSA_4$ is the second largest among the $RSA_1$, $RSA_2$, $RSA_3$, and $RSA_4$.

[4] The coated cutting tool according to any one of [1] to [3], wherein an average thickness of the intermediate layer is 3.0 μm or more and 15.0 μm or less.

[5] The coated cutting tool according to any one of [1] to [4], wherein an average thickness of the lower layer is 3.0 μm or more and 15.0 μm or less.

[6] The coated cutting tool according to any one of [1] to [5], wherein the lower layer comprises at least one layer selected from the group consisting of a TiN layer containing TiN, a TiC layer containing TiC, a TiCN layer containing TiCN, a TiCNO layer containing TiCNO, a TiON layer containing TiON, and a $TiB_2$ layer containing $TiB_2$.

[7] The coated cutting tool according to any one of [1] to [6], wherein the substrate is any one of a cemented carbide, a cermet, a ceramic, or a cubic boron nitride sintered body.

Advantageous Effects of Invention

The present invention can provide a coated cutting tool which has excellent wear resistance and fracture resistance and which accordingly allows for an extended tool life.

BRIEF DESCRIPTION OF DRAWINGS

The FIGURE is a schematic view showing an example of a coated cutting tool according to the present invention.

DESCRIPTION OF EMBODIMENTS

An embodiment for carrying out the present invention (hereinafter simply referred to as the "present embodiment") will hereinafter be described in detail, with reference to the attached drawings as appropriate. However, the present invention is not limited to the present embodiment below. Various modifications may be made to the present invention without departing from the gist of the invention. In the drawings, unless otherwise specified, positional relationships, such as vertical and horizontal relationships, are based on the positional relationships shown in the drawings. Further, the dimensional ratios of the drawings are not limited to those shown therein.

The coated cutting tool of the present embodiment includes a substrate and a coating layer formed on a surface of the substrate. The coating layer includes a lower layer, an intermediate layer, and an upper layer in this order from the substrate side. The lower layer includes one or more Ti compound layers that contains a Ti compound, where the Ti compound includes Ti and an element of at least one kind selected from the group consisting of C, N, O and B. The intermediate layer includes an $\alpha$-$Al_2O_3$ layer that contains of $\alpha$-$Al_2O_3$, and the upper layer includes a TiCN layer that contains TiCN. An average thickness of the coating layer is 5.0 μm or more and 30.0 μm or less, and an average thickness of the upper layer is 1.0 μm or more and 6.0 μm or less. In a cross section perpendicular to the surface of the substrate, a ratio of grains having an aspect ratio of 2 or more and 10 or less among the grains in the TiCN layer constituting the upper layer is 60 area % or more and 95 area % or less; and in the grains having an aspect ratio of 2 or more and 10 or less among the grains in the TiCN layer constituting the upper layer, a misorientation A satisfies a condition represented by a following formula (1):

$$40 \leq RSA_1 \leq 90 \tag{1}$$

(In the formula, $RSA_1$ is a ratio (unit: area %) of a cross-sectional area of grains having a misorientation A of 0 degrees or more and less than 10 degrees to a cross-sectional area of grains having a misorientation A of 0 degrees or more and 45 degrees or less, and the misorientation A is an angle (unit: degree) formed by a normal to the surface of the substrate and a normal to a (111) orientation of the grain of the TiCN layer in the upper layer).

The coated cutting tool of the present embodiment comprises the above-described configurations, and this allows the wear resistance and fracture resistance of the coated cutting tool to be improved; as a result, the tool life thereof can be extended. The factors for the improvements in wear resistance and fracture resistance of the coated cutting tool of the present embodiment can be considered to be set forth as follows. However, the present invention is not in any way limited by the factors set forth below. In other words, firstly, the coated cutting tool of the present embodiment includes, as the lower layer of the coating layer, at least one Ti compound layer containing a Ti compound of Ti and an element of at least one kind selected from the group consisting of C, N, O and B. If the coated cutting tool of the present embodiment comprises such lower layer between the substrate and the intermediate layer containing an $\alpha$-$Al_2O_3$ layer that contains $\alpha$-aluminum oxide ($\alpha$-$Al_2O_3$), this leads to improved wear resistance and adhesion. Further, since the coated cutting tool of the present embodiment has an upper layer having a TiCN layer as an outer layer with respect to the intermediate layer having an $\alpha$-$Al_2O_3$ layer, the TiCN layer of the upper layer comes into contact with a workpiece material before the $\alpha$-$Al_2O_3$ layer. As a result, the coated cutting tool of the present embodiment allows for the suppression of crater wear in the $\alpha$-$Al_2O_3$ layer which would otherwise be caused, particularly until the cutting temperature has been increased. While the mechanism here has not been made clear, the reason for the above suppression can be inferred to be that, with regard to a hardness at a low temperature, such hardness of the TiCN layer is higher than that of the $\alpha$-$Al_2O_3$ layer. In the coated cutting tool of the present embodiment, the upper layer has a high hardness since it contains TiCN layer, thereby resulting in improved wear resistance. Further, in the coated cutting tool of the present embodiment, the upper layer includes TiCN grains having an aspect ratio of 2 or more and 10 or less. Where the aspect ratio of the TiCN grains contained in the upper layer of the coated cutting tool of the present embodiment is 2 or more, an effect of suppressing the falling of grains of the TiCN layer of the upper layer is obtained. Meanwhile, where the aspect ratio of the TiCN grains contained in the upper layer is 10 or less, the cutting tool can be easily manufactured. Further, in the coated cutting tool of the present embodiment, where the ratio of the grains having an aspect ratio of 2 or more and 10 or less among the grains of the TiCN layer constituting the upper layer is 60 area % or more in the cross section perpendicular to the surface of the substrate, an effect of suppressing the falling of grains of the TiCN layer of the upper layer is obtained. As a result, the fracture resistance of the coated cutting tool of the present embodiment is further improved. Meanwhile, in the coated cutting tool of the present embodiment, where the ratio of the grains having an aspect ratio of 2 or more and 10 or less among the grains of the TiCN layer constituting the upper layer is 95 area % or less in the cross section perpendicular to the surface of the substrate, the cutting tool can be easily manufactured. Further, in the coated cutting tool of the present embodiment, in the grains having an aspect ratio of 2 or more and 10 or less among the grains of the TiCN layer constituting the upper layer, a misorientation A satisfies a condition represented by the following formula (1):

$$40 \leq RSA_1 \leq 90 \quad (1)$$

(In the formula, $RSA_1$ is a ratio (unit: area %) of a cross-sectional area of grains having a misorientation A of 0 degrees or more and less than 10 degrees to a cross-sectional area of grains having a misorientation A of 0 degrees or more and 45 degrees or less, and the misorientation A is an angle (unit: degree) formed by a normal to the surface of the substrate and a normal to a (111) orientation of the grain of the TiCN layer in the upper layer).

Where the $RSA_1$ is 40 area % or more, the wear resistance of the coated cutting tool of the present embodiment is further improved. Although the mechanism thereof is not clear, it is presumed that in the case of the (111) orientation of a cubic crystal, since the structure is close-packed, where the $RSA_1$ is 40 area % or more, the TiCN layer becomes dense and the hardness is improved, thereby improving the wear resistance of the coated cutting tool. Meanwhile, where the $RSA_1$ is 90 area % or less, the coated cutting tool of the present embodiment can be easily manufactured. Moreover, where the average thickness of the upper layer is 1.0 μm or more, the effect demonstrated as a result of the cutting tool of the present embodiment having the upper layer can be obtained. Meanwhile, where the average thickness of the upper layer is 6.0 μm or less, the fracture resistance is improved mainly due to suppression of peeling of the coating layer. Further, in the coated cutting tool of the present embodiment, where the average thickness of the coating layer is 5.0 μm or more, the wear resistance is improved, and where the average thickness of the coating layer is 30.0 μm or less, the fracture resistance is improved mainly due to suppression of peeling of the coating layer. The combining of the above configurations allows for the coated cutting tool of the present embodiment to have improved wear resistance and fracture resistance, and accordingly, it can be considered that the tool life can be extended.

The FIGURE is a schematic cross-sectional view showing an example of a coated cutting tool according to the present embodiment. A coated cutting tool 6 is provided with a substrate 1 and a coating layer 5 located on a surface of the substrate 1, and a lower layer 2, an intermediate layer 3 and an upper layer 4 are laminated in this order from the substrate side in an upward direction in the coating layer 5.

A coated cutting tool according to the present embodiment comprises a substrate and a coating layer formed on a surface of the substrate. Specific examples of types of the coated cutting tool include an indexable cutting insert for milling or turning, a drill and an end mill.

The substrate used in the present embodiment is not particularly limited, as long as it may be used as a substrate for a coated cutting tool. Examples of such substrate include a cemented carbide, cermet, ceramic, a cubic boron nitride sintered body, a diamond sintered body and high-speed steel. From among the above examples, the substrate is preferably comprised of a cemented carbide, cermet, ceramic or a cubic boron nitride sintered body as this provides further excellent wear resistance and fracture resistance, and, from the same perspective, the substrate is more preferably comprised of a cemented carbide.

It should be noted that the surface of the substrate may be modified. For instance, when the substrate is comprised of a cemented carbide, a β-free layer may be formed on the surface thereof, and when the substrate is comprised of cermet, a hardened layer may be formed on the surface thereof. The operation and effects of the present invention are still provided even if the substrate surface has been modified in this way.

The average thickness of the coating layer used in the present embodiment is 5.0 μm or more and 30.0 μm or less. In the coated cutting tool of the present embodiment, where the average thickness of the coating layer is 5.0 μm or more, the wear resistance is improved, and where the average thickness of the coating layer is 30.0 μm or less, the fracture resistance is improved mainly due to the suppression of peeling of the coating layer. From the same viewpoint, the average thickness of the coating layer is preferably 8.0 μm or more and 25.0 μm or less, more preferably 10.0 μm or more and 23.0 μm or less, and even more preferably 11.5 μm or more and 22.5 μm or less. It should be noted that, as to the average thickness of each layer and the average thickness of the entire coating layer in the coated cutting tool of the present embodiment, each of such average thicknesses can be obtained by: measuring the thickness of each layer or the thickness of the entire coating layer from each of the cross-sectional surfaces at three or more locations in each layer or in the entire coating layer; and then calculating the arithmetic mean of the resulting measurements.

Lower Layer

The lower layer used in the present embodiment comprises one or more Ti compound layers containing a Ti compound of Ti and an element of at least one kind selected from the group consisting of C, N, O and B. If the coated cutting tool of the present embodiment comprises such lower layer between a substrate and an intermediate layer containing α-aluminum oxide (α-$Al_2O_3$) layer, this leads to improved wear resistance and adhesion.

Examples of the Ti compound layers include a TiC layer containing TiC, a TiN layer containing TiN, a TiCN layer containing TiCN, a TiCO layer containing TiCO, a TiCNO layer containing TiCNO, a TiON layer containing TiON and a $TiB_2$ layer containing $TiB_2$.

The lower layer may be constituted by a single layer or multiple layers (for example, two or three layers). However, the lower layer is preferably constituted by multiple layers, is more preferably constituted by two or three layers, and is further preferably constituted by three layers. From the perspective of further improving wear resistance and adhesion, the lower layer preferably comprises a layer of at least one kind selected from the group consisting of a TiN layer composed of TiN, a TiC layer composed of TiC, a TiCN layer composed of TiCN, a TiCNO layer composed of TiCNO, a TiON layer composed of TiON and a $TiB_2$ layer composed of $TiB_2$. In the coated cutting tool of the present embodiment, if at least one layer of the lower layer is a TiCN layer, this indicates the tendency of the wear resistance to be further improved. In the coated cutting tool of the present embodiment, if at least one layer of the lower layer is a TiN layer and if such TiN layer is formed on a surface of a substrate, this indicates the tendency of the adhesion to be further improved. In the coated cutting tool of the present embodiment, if at least one layer of the lower layer is a TiCNO layer and if such TiCNO layer is formed so as to come into contact with the intermediate layer having α-Al$_2$O$_3$ layer, this indicates the tendency of the adhesion to be further improved. When the lower layer is constituted by three layers: a TiC layer or a TiN layer, serving as a first layer, may be formed on a surface of the substrate; a TiCN layer, serving as a second layer, may be formed on a surface of the first layer; and a TiCNO layer or a TiCO layer, serving as a third layer, may be formed on a surface of the second layer. In particular, as to the lower layer: a TiN layer, serving as a first layer, may be formed on a surface of the substrate; a TiCN layer, serving as a second layer, may be formed on a surface of the first layer; and a TiCNO layer, serving as a third layer, may be formed on a surface of the second layer.

The average thickness of the lower layer used in the present embodiment is preferably 3.0 μm or more and 15.0 μm or less. Where the average thickness of the lower layer is 3.0 μm or more, the wear resistance of the coated cutting tool of the present embodiment tends to be further improved. Meanwhile, where the average thickness of the lower layer is 15.0 μm or less, the fracture resistance of the coated cutting tool of the present embodiment tends to be further improved mainly due to the suppression of peeling of the coating layer. From the same viewpoint, the average thickness of the lower layer is more preferably 4.0 μm or more and 13.0 μm or less, and even more preferably 4.5 μm or more and 10.5 μm or less.

From the viewpoint of further improving the wear resistance and fracture resistance, the average thickness of the TiC layer or TiN layer is preferably 0.05 μm or more and 1.0 μm or less. From the same viewpoint, the average thickness of the TiC layer or TiN layer is more preferably 0.10 μm or more and 0.50 μm or less, and even more preferably 0.15 μm or more and 0.30 μm or less.

From the viewpoint of further improving the wear resistance and fracture resistance, the average thickness of the TiCN layer is preferably 3.0 μm or more and 12.0 μm or less. From the same viewpoint, the average thickness of the TiCN layer is more preferably 3.5 μm or more and 11.0 μm or less, and even more preferably 4.0 μm or more and 10.0 μm or less.

From the viewpoint of further improving the wear resistance and fracture resistance, the average thickness of the TiCNO layer or TiCO layer is preferably 0.1 μm or more and 1.0 μm or less. From the same viewpoint, the average thickness of the TiCNO layer or the TiCO layer is more preferably 0.15 μm or more and 0.70 μm or less, and even more preferably 0.20 μm or more and 0.50 μm or less.

The Ti compound layer is composed of a Ti compound of Ti and an element of at least one kind selected from the group consisting of C, N, O, and B. However, such Ti compound layer may contain a very small amount of components other than the above elements, as long as it provides the operation and effects of the lower layer.

Intermediate Layer

The intermediate layer used in the present embodiment has an α-Al$_2$O$_3$ layer.

The average thickness of the intermediate layer used in the present embodiment is preferably 3.0 μm or more and 15.0 μm or less. Where the average thickness of the intermediate layer having the α-Al$_2$O$_3$ layer is 3.0 μm or more, the crater wear resistance on the rake face of the coated cutting tool tends to be further improved. Where the average thickness of the intermediate layer having the α-Al$_2$O$_3$ layer is 15.0 μm or less, peeling of the coating layer is further suppressed, and the fracture resistance of the coated cutting tool tends to be further improved. From the same viewpoint, the average thickness of the intermediate layer is more preferably 4.0 μm or more and 13.0 μm or less, and even more preferably 5.0 μm or more and 10.0 μm or less.

The intermediate layer may contain α-aluminum oxide (α-Al$_2$O$_3$), and may or may not contain components other than α-aluminum oxide (α-Al$_2$O$_3$), as long as it provides the operation and effects of the present invention.

Upper Layer

The upper layer used in the present embodiment contains TiCN layer. In the coated cutting tool of the present embodiment, the upper layer having TiCN layer leads to a high hardness, thereby resulting in improved wear resistance. Further, in the coated cutting tool of the present embodiment, the upper layer having TiCN layer serves as a layer exterior to the intermediate layer having α-Al$_2$O$_3$ layer. Since, in the coated cutting tool of the present embodiment, the upper layer having TiCN layer serves as a layer exterior to the intermediate layer having α-Al$_2$O$_3$ layer, the TiCN layer of the upper layer comes into contact with a workpiece material before coming into contact with the α-Al$_2$O$_3$ layer. Thus, the coated cutting tool of the present embodiment particularly allows for the suppression of crater wear of the α-Al$_2$O$_3$ layer which would otherwise be caused until the cutting temperature has been increased.

Furthermore, the upper layer used in the present embodiment includes TiCN grains having an aspect ratio of 2 or more and 10 or less. In the coated cutting tool of the present embodiment, where the aspect ratio of the TiCN grains contained in the upper layer is 2 or more, the effect of suppressing the falling of grains of the TiCN layer of the upper layer can be obtained. Meanwhile, where the aspect ratio of the TiCN grains contained in the upper layer is 10 or less, the coated cutting tool of the present embodiment can be easily manufactured. Further, in the coated cutting tool of the present embodiment, in a cross section perpendicular to the surface of the substrate, the ratio of grains having an aspect ratio of 2 or more and 10 or less among the grains of the TiCN layer constituting the upper layer is 60 area % or more and 95 area % or less. In the coated cutting tool of the present embodiment, where the ratio of grains having an aspect ratio of 2 or more and 10 or less in the TiCN layer constituting the upper layer is 60 area % or more in the cross section perpendicular to the surface of the substrate, the effect of suppressing the falling of grains of the TiCN layer of the upper layer can be obtained. As a result, the fracture resistance of the coated cutting tool of the present embodiment is further improved. Meanwhile, where the ratio of grains having an aspect ratio of 2 or more and 10 or less in the TiCN layer constituting the upper layer is 95 area % or less in the cross section perpendicular to the surface of the substrate, the coated cutting tool of the present embodiment can be easily manufactured. From the same viewpoint, in the cross section perpendicular to the surface of the substrate, the ratio of grains having an aspect ratio of 2 or more and 10 or less in the TiCN layer constituting the upper layer is more preferably 60 area % or more and 93 area % or less, and even more preferably 60 area % or more and 92 area % or less.

In the coated cutting tool of the present embodiment, in the grains having an aspect ratio of 2 or more and 10 or less among the grains of the TiCN layer constituting the upper layer, a misorientation A satisfies a condition represented by a following formula (1):

$$40 \leq RSA_1 \leq 90 \tag{1}$$

(In the formula, RSA$_1$ is a ratio (unit: area %) of a cross-sectional area of grains having a misorientation A of 0 degrees or more and less than 10 degrees to a cross-sectional area of grains having a misorientation A of 0 degrees or more and 45 degrees or less, and the misorientation A is an angle (unit: degree) formed by a normal to the surface of the substrate and a normal to a (111) orientation of the grain of the TiCN layer in the upper layer).

Where the $RSA_1$ is 40 area % or more, the wear resistance of the coated cutting tool of the present embodiment is further improved. Although the mechanism thereof is not clear, it is presumed that in the case of the (111) orientation of a cubic crystal, since the orientation is close-packed, where the $RSA_1$ is 40 area % or more, the TiCN layer becomes dense and the hardness is improved, thereby improving the wear resistance of the coated cutting tool. Meanwhile, where the $RSA_1$ is 90 area % or less, the coated cutting tool of the present embodiment can be easily manufactured. From the same viewpoint, the $RSA_1$ is more preferably 50 area % or more and 90 area % or less, and even more preferably 60 area % or more and 90 area % or less.

Further, in the coated cutting tool of the present embodiment, where the ratio of a cross-sectional area of grains having a misorientation A of 0 degrees or more and less than 10 degrees, the ratio of a cross-sectional area of grains having a misorientation A of 10 degree or more and less than 20 degrees, the ratio of a cross-sectional area of grains having a misorientation A of 20 degree or more and less than 30 degrees, and the ratio of a cross-sectional area of grains having a misorientation A of 30 degree or more and 45 degrees or less to the cross-sectional area of grains having a misorientation A of 0 degrees or more and 45 degrees or less is denoted by $RSA_1$, $RSA_2$, $RSA_3$, and $RSA_4$, respectively, it is preferable that the $RSA_1$ be the largest and the $RSA_4$ be the second largest among the $RSA_1$, $RSA_2$, $RSA_3$, and $RSA_4$. Where the $RSA_1$ is the largest and the $RSA_4$ is the second largest, the wear resistance of the coated cutting tool of the present embodiment tends to be further improved. The mechanism thereof is not clear, but it is presumed that where the $RSA_4$ is the second largest, the ratio of TiCN grains with a misorientation A grown more to the 0-degree side among the TiCN grains having a misorientation A of 0 degrees or more and less than 10 degrees tends to increase, so that the wear resistance of the coated cutting tool tends to be further improved. Meanwhile, where the $RSA_2$ is the second largest, the ratio of TiCN grains with a misorientation A grown more to the 10-degree side among the TiCN grains having a misorientation A of 0 degrees or more and less than 10 degrees tends to increase. Further, where the $RSA_3$ is the second largest, the ratio of TiCN grains with a misorientation A grown more to the 10-degree side among the TiCN grains having a misorientation A of 0 degrees or more and less than 10 degrees tends to increase. It is presumed that this difference affects the wear resistance of the coated cutting tool.

Further, in the coated cutting tool of the present embodiment, the average thickness of the upper layer is 1.0 μm or more and 6.0 μm or less. Where the average thickness of the upper layer is 1.0 μm or more, the effect demonstrated as a result of the cutting tool of the present embodiment having the upper layer can be obtained. Meanwhile, where the average thickness of the upper layer is 6.0 μm or less, the fracture resistance is improved mainly due to the suppression of peeling of the coating layer. From the same viewpoint, the average thickness of the upper layer is more preferably 1.5 μm or more and 5.9 μm or less, and even more preferably 2.0 μm or more and 5.8 μm or less.

In the present embodiment, the ratio of grains having an aspect ratio of 2 or more and 10 or less among the grains of the TiCN layer constituting the upper layer can be determined by observing the cross-sectional structure of the upper layer having the TiCN layer with an electron backscatter diffraction image apparatus (EBSD) incorporated in a commercially available field emission scanning electron microscope (FE-SEM) or a transmission electron microscope (TEM). Specifically, the cross section of the upper layer having the TiCN layer among the cross sections perpendicular to the surface of the substrate in the coated cutting tool is mirror-polished, and the obtained mirror-polished surface is taken as the cross-sectional structure. The method of mirror polishing the cross section of the upper layer having the TiCN layer is not particularly limited, and examples thereof include a method of polishing using diamond paste and/or colloidal silica and ion milling. A sample having the cross-sectional structure of the coated cutting tool is set in the FE-SEM, and the cross-sectional structure of the sample is irradiated with an electron beam with an acceleration voltage of 15 kV and an irradiation current of 1.0 nA at an incident angle of 70 degrees. It is preferable to measure the cross-sectional structure in the upper layer having the TiCN layer of the coated cutting tool by EBSD in the range of the average thickness of the upper layer having the TiCN layer×50 μm and the step size of 0.1 μm. At this time, a boundary having a misorientation of 5° or more is regarded as a crystal grain boundary, and a region surrounded by the crystal grain boundary is taken as a grain. Here, the crystal grain size means a crystal grain size in a direction perpendicular to the film thickness direction of the coating layer. The aspect ratio is a value obtained by dividing the crystal grain size of the grain in the film thickness direction of the coating layer by the crystal grain size of the grain in the direction perpendicular to the film thickness direction. At this time, image analysis software may be used when obtaining the crystal grain size from the cross-sectional structure of the upper layer having the TiCN layer. The crystal grain size of the upper layer having the TiCN layer in the range of the average thickness of the upper layer having the TiCN layer×50 μm is measured, and the aspect ratio of all the grains can be obtained from the crystal grain size in each direction. Here, assuming that the range of the average thickness of the upper layer having the TiCN layer×50 μm is 100 area %, the ratio of the area occupied by the TiCN grains having an aspect ratio of 2 or more and 10 or less can be calculated.

In the present embodiment, $RSA_1$, $RSA_2$, $RSA_3$, and $RSA_4$ can be obtained by the following method. In the grains having an aspect ratio of 2 or more and 10 or less among the grains of the TiCN layer constituting the upper layer, the sum ($RSA_{Total}$) of the areas of the cross sections of the grains having a misorientation A of the angle formed between the normal to the surface of the substrate and the normal to the (111) orientation of the grains of the TiCN layer in the upper layer of 0° or more and 45° or less, the cross sections being perpendicular to the surface of the substrate, is taken as 100 area %, a ratio (area %) of the sum of the cross-sectional areas of grains having a misorientation A of 0 degrees or more and 10 degrees or less to the $RSA_{Total}$ may be determined and this ratio may be taken as the $RSA_1$. When obtaining the RSA (area %), the cross-sectional area of each grain can be measured using, for example, an electron backscatter diffraction pattern apparatus (EBSD) incorporated in a scanning electron microscope (SEM), a field emission scanning electron microscope (FE-SEM) or the like. With the EBSD, the crystal orientation of each crystal of the grains is determined, the cross-sectional area of the grain with specified crystal orientation is classified into one of the divisions in, for example, respective 5-degree pitches, and the cross-sectional areas of the grains in each division are obtained. Thereafter, for example, a sum of the cross-sectional areas of grains is obtained for the following divisions: a division of 0 degrees or more and less than 10 degrees, a division of 10 degrees or more and less than 20 degrees, a division of 20 degrees or more and less than 30 degrees, and a division of 30 degrees or more to 45 degrees or less, a ratio of the cross-sectional areas of grains for each of the divisions to the $RSA_{Total}$ (100 area %) is obtained, and the resulting ratios are taken as $RSA_1$, $RSA_2$, $RSA_3$, and $RSA_4$ in the above order.

The upper layer may contain TiCN, and may or may not contain components other than TiCN, as long as it provides the operation and effects of the present invention.

Method for Forming Coating Layer

In the coated cutting tool of the present embodiment, each of the layers which constitute the coating layer may be formed by chemical vapor deposition or by physical vapor deposition. Specific examples of a method of forming the layers of the coating layer include the method set forth below. However, the method of forming such layers is not limited thereto.

Chemical Vapor Deposition

For instance, a Ti compound layer, being comprised of a Ti nitride layer (hereinafter also referred to as a "TiN layer"), can be formed by chemical vapor deposition with a raw material composition of $TiCl_4$: from 5.0 mol % or more to 10.0 mol % or less, $N_2$: from 20 mol % or more to 60 mol % or less, and $H_2$: the balance, a temperature of from 850° C. or higher to 950° C. or lower, and a pressure of from 300 hPa or higher to 400 hPa or lower.

A Ti compound layer, being comprised of a Ti carbide layer (hereinafter also referred to as a "TiC layer"), can be formed by chemical vapor deposition with a raw material composition of $TiCl_4$: from 1.5 mol % or more to 3.5 mol % or less, $CH_4$: from 3.5 mol % or more to 5.5 mol % or less, and $H_2$: the balance, a temperature of from 950° C. or higher to 1,050° C. or lower, and a pressure of from 70 hPa or higher to 80 hPa or lower.

A Ti compound layer, being comprised of a Ti carbonitride layer (hereinafter also referred to as a "TiCN layer"), can be formed by chemical vapor deposition with a raw material composition of $TiCl_4$: from 5.0 mol % or more to 7.0 mol % or less, $CH_3CN$: from 0.5 mol % or more to 1.5 mol % or less, and $H_2$: the balance, a temperature of from 800° C. or higher to 900° C. or lower, and a pressure of from 60 hPa or higher to 80 hPa or lower.

A Ti compound layer, being comprised of a Ti oxycarbonitride layer (hereinafter also referred to as a "TiCNO layer"), can be formed by chemical vapor deposition with a raw material composition of $TiCl_4$: from 3.0 mol % or more to 4.0 mol % or less, CO: from 0.5 mol % or more to 1.0 mol % or less, $N_2$: from 30 mol % or more to 40 mol % or less, and $H_2$: the balance, a temperature of from 950° C. or higher to 1,050° C. or lower, and a pressure of from 50 hPa or higher to 150 hPa or lower.

A Ti compound layer, being comprised of a Ti carboxide layer (hereinafter also referred to as a "TiCO layer"), can be formed by chemical vapor deposition with a raw material composition of $TiCl_4$: from 1.0 mol % or more to 2.0 mol % or less, CO: from 2.0 mol % or more to 3.0 mol % or less, and $H_2$: the balance, a temperature of from 950° C. or higher to 1,050° C. or lower, and a pressure of from 50 hPa or higher to 150 hPa or lower.

An intermediate layer, being comprised of an $\alpha$-$Al_2O_3$ layer (hereinafter also simply referred to as an "$Al_2O_3$ layer"), can be obtained by, for example, the method set forth below.

Firstly, a lower layer, being comprised of one or more Ti compound layers, is formed on a surface of a substrate. Next, from among such layers, a surface of a layer which is most distant from the substrate is oxidized. Thereafter, an intermediate layer including an $\alpha$-$Al_2O_3$ layer is formed on the surface of the layer which is most distant from the substrate.

More specifically, the oxidation of the surface of the layer which is most distant from the substrate is performed under the conditions of a gas composition of $CO_2$: from 0.3 mol % or more to 1.0 mol % or less and $H_2$: the balance, a temperature of from 950° C. or higher to 1,050° C. or lower, and a pressure of from 50 hPa or higher to 70 hPa or lower (an oxidation step). Here, the oxidation process time is preferably from 1 minute or more to 3 minutes or less.

The $\alpha$-$Al_2O_3$ layer is then formed by chemical vapor deposition with a raw material gas composition of $AlCl_3$: from 2.0 mol % or more to 5.0 mol % or less, $CO_2$: from 2.5 mol % or more to 4.0 mol % or less, HCl: from 2.0 mol % or more to 3.0 mol % or less, $H_2S$: from 0.30 mol % or more to 0.40 mol % or less, and $H_2$: the balance, a temperature of from 950° C. or higher to 1,050° C. or lower, and a pressure of from 60 hPa or higher to 80 hPa or lower (a deposition step).

Further, an upper layer, being comprised of a Ti carbonitride layer (hereinafter referred to as a "TiCN layer"), is formed on a surface of the $\alpha$-$Al_2O_3$ layer.

A TiCN layer can be formed by chemical vapor deposition at a temperature of 900° C. to 980° C. and a pressure of 60 hPa to 80 hPa by using a raw material composition including $TiCl_4$: 6.0 mol % to 10.0 mol %, $CH_3CN$: 0.5 mol % to 1.5 mol %, $N_2$: 10.0 mol % to 30.0 mol %, and $H_2$: the balance (an upper layer formation step).

In order to set the ratio of grains having an aspect ratio of 2 or more and 10 or less among the TiCN layer grains constituting the upper layer to a specific range, the temperature may be controlled in the upper layer formation step, or $CH_3CN$ may be used instead of conventional $CH_4$ as the raw material and the ratio of $CH_3CN$ and/or $TiCl_4$ in the raw material composition may be controlled. More specifically, the aspect ratio of the TiCN grains is increased by lowering the temperature in the upper layer formation step or increasing the ratio of $TiCl_4$ in the raw material composition. As a result, it is possible to increase the ratio of TiCN grains having an aspect ratio of 2 or more and 10 or less. Further, the aspect ratio of TiCN grains is also increased by increasing the ratio of $TiCl_4$ to $CH_3CN$ ($TiCl_4$/$CH_3CN$) in the raw material composition in the upper layer formation step. As a result, it is possible to increase the ratio of TiCN grains having an aspect ratio of 2 or more and 10 or less. Meanwhile, by increasing the temperature in the upper layer formation step or increasing the ratio of $CH_3CN$ in the raw material composition, the aspect ratio of TiCN grains is reduced. As a result, it is possible to decrease the ratio of TiCN grains having an aspect ratio of 2 or more and 10 or less.

Further, in order to set $RSA_1$ into a specific range, in the upper layer formation step, the temperature and/or pressure may be controlled, or $CH_3CN$ may be used as a raw material instead of conventional $CH_4$, and the ratio of $CH_3CN$ and/or $N_2$ in the raw material composition may be controlled. More specifically, $RSA_1$ can be reduced by lowering the temperature or increasing the pressure in the upper layer formation step. Meanwhile, $RSA_1$ can be increased by increasing the ratio of $CH_3CN$ and/or $N_2$ in the raw material composition in the upper layer formation step.

The thickness of each layer in the coating layer of the coated cutting tool of the present embodiment can be measured by observing a cross-sectional structure of the coated cutting tool, using an optical microscope, a scanning electron microscope (SEM), a field emission scanning electron microscope (FE-SEM), or the like. It should be noted that, as to the average thickness of each layer in the coated cutting tool of the present embodiment, such average thickness can be obtained by: measuring the thickness of each layer at three or more locations near the position 50 μm from the edge, toward the center of the rake surface of the coated cutting tool; and calculating the arithmetic mean of the resulting measurements. Further, the composition of each layer in the coating layer of the coated cutting tool of the present embodiment can be measured from a cross-sectional structure of the coated cutting tool, using an energy-dispersive X-ray spectroscope (EDS), a wavelength-dispersive X-ray spectroscope (WDS), or the like.

The coated cutting tool of the present embodiment can be considered to bring about the effect of being capable of extending the tool life more than that involved in the prior art due to the point of having excellent fracture resistance and wear resistance. In particular, in the coated cutting tool of the present embodiment, the falling of grains of the TiCN layer of the upper layer under conditions such that a load resulting in high feed and deep cutting load is applied is suppressed, which is apparently why the wear resistance can be improved and the fracture resistance can be also improved, so that the effect that the tool life can be extended as compared with the conventional one is exhibited.

However, the factor of such extension of the tool life is not limited thereto.

Examples

Although the present invention will be described in further detail below by way of examples, the present invention is not limited to such examples.

As a substrate, a cemented carbide having a composition of 88.7WC-8.1Co-1.5TiN-1.4NbC-0.3$Cr_3C_2$ (the above numbers are mass %) and machined to an insert shape of CNMG120412, and a cemented carbide having a composition of 89.9WC-7.1Co-1.5TiN-1.4NbC-0.1$Cr_3C_2$ (the above numbers are mass %) and machined to an insert shape of CNMG120412 were prepared. The edges of these substrates were subjected to round honing by means of an SiC brush, and surfaces of the substrates were then washed.

Invention Samples 1 to 12 and Comparative Samples 1 to 8

After the substrate surface was washed, a coating layer was formed by chemical vapor deposition. Firstly, the substrate was inserted into an external heating chemical vapor deposition apparatus, and a lower layer, whose composition is shown in Table 2, was formed on the substrate surface, in the order of a first layer, a second layer and a third layer, so as to have the respective average thicknesses shown in Table 2 under the raw material composition, temperature and pressure conditions shown in Table 1. Then, the surface of the lower layer was oxidized for 1 minute under the conditions of: a gas composition of CO2: 0.5 mol % and H2: 99.5 mol %, a temperature of 1,000° C., and a pressure of 60 hPa. Next, an intermediate layer, being comprised of α-aluminum oxide, was formed on the oxidized surface of the lower layer so as to have the average thickness shown in Table 2 under the raw material composition, temperature and pressure conditions shown in Table 1. Lastly, an upper layer, whose composition is shown in Table 2, was formed on the surface of the intermediate layer so as to have the average thickness shown in Table 2 under the raw material composition, temperature and pressure conditions shown in Table 3. As a result, the coated cutting tools of invention samples 1 to 12 and comparative samples 1 to 8 were obtained.

TABLE 1

| Composition of each layer | | Temperature (° C.) | Pressure (hPa) | Raw material composition (mol %) |
|---|---|---|---|---|
| Lower layer | TiN | 900 | 350 | $TiCl_4$: 7.5%, $N_2$: 40.0%, $H_2$: 52.5% |
| | TiC | 1000 | 75 | $TiCl_4$: 2.4%, $CH_4$: 4.6%, $H_2$: 93.0% |
| | TiCN | 850 | 70 | $TiCl_4$: 6.0%, $CH_3CN$: 1.0%, $H_2$: 93.0% |
| | TiCNO | 1000 | 100 | $TiCl_4$: 3.5%, CO: 0.7%, $N_2$: 35.5%, $H_2$: 60.3% |
| Intermediate layer | α-$Al_2O_3$ | 1000 | 70 | $AlCl_3$: 2.5%, $CO_2$: 3.0%, HCl: 2.3%, $H_2S$: 0.35%, $H_2$: 91.85% |

TABLE 2

| | Coating layer | | | | | | | | | | | |
|---|---|---|---|---|---|---|---|---|---|---|---|---|
| | Lower layer | | | | | | Intermediate layer | | | Upper layer | | Average thickness of entire |
| | First layer | | Second layer | | Third layer | | Thickness of entire lower layer | | Crystal system | Average thickness (μm) | | Average thickness (μm) | coating layer (μm) |
| Sample Number | Composition | Average thickness (μm) | Composition | Average thickness (μm) | Composition | Average thickness (μm) | | Composition | | | Composition | | |
| Invention sample 1 | TiN | 0.2 | TiCN | 6.0 | TiCNO | 0.3 | 6.5 | $Al_2O_3$ | α | 9.0 | TiCN | 2.0 | 17.5 |
| Invention sample 2 | TiN | 0.2 | TiCN | 6.0 | TiCNO | 0.3 | 6.5 | $Al_2O_3$ | α | 9.0 | TiCN | 2.0 | 17.5 |
| Invention sample 3 | TiN | 0.2 | TiCN | 6.0 | TiCNO | 0.3 | 6.5 | $Al_2O_3$ | α | 9.0 | TiCN | 2.0 | 17.5 |

TABLE 2-continued

| | Coating layer | | | | | | | | | | | |
|---|---|---|---|---|---|---|---|---|---|---|---|---|
| | Lower layer | | | | | | Intermediate layer | | | Upper layer | | Average thickness |
| | First layer | | Second layer | | Third layer | | Thickness of entire lower layer | | Crystal system | Average thickness (μm) | | |
| Sample Number | Composition | Average thickness (μm) | Composition | Average thickness (μm) | Composition | Average thickness (μm) | | Composition | | | Composition | Average thickness (μm) | of entire coating layer (μm) |
| Invention sample 4 | TiN | 0.2 | TiCN | 6.0 | TiCNO | 0.3 | 6.5 | Al₂O₃ | α | 9.0 | TiCN | 2.0 | 17.5 |
| Invention sample 5 | TiC | 0.2 | TiCN | 6.0 | TiCNO | 0.3 | 6.5 | Al₂O₃ | α | 9.0 | TiCN | 2.0 | 17.5 |
| Invention sample 6 | TiN | 0.2 | TiCN | 6.0 | TiCNO | 0.3 | 6.5 | Al₂O₃ | α | 9.0 | TiCN | 4.0 | 19.5 |
| Invention sample 7 | TiN | 0.2 | TiCN | 6.0 | TiCNO | 0.3 | 6.5 | Al₂O₃ | α | 9.0 | TiCN | 5.8 | 21.3 |
| Invention sample 8 | TiN | 0.2 | TiCN | 8.0 | TiCNO | 0.3 | 8.5 | Al₂O₃ | α | 8.0 | TiCN | 2.0 | 18.5 |
| Invention sample 9 | TiN | 0.2 | TiCN | 6.0 | TiCNO | 0.3 | 6.5 | Al₂O₃ | α | 5.0 | TiCN | 4.0 | 15.5 |
| Invention sample 10 | TiN | 0.2 | TiCN | 6.0 | TiCNO | 0.3 | 6.5 | Al₂O₃ | α | 5.0 | TiCN | 4.0 | 15.5 |
| Invention sample 11 | TiN | 0.2 | TiCN | 4.0 | TiCNO | 0.3 | 4.5 | Al₂O₃ | α | 5.0 | TiCN | 2.0 | 11.5 |
| Invention sample 12 | TiN | 0.2 | TiCN | 10.0 | TiCNO | 0.3 | 10.5 | Al₂O₃ | α | 10.0 | TiCN | 2.0 | 22.5 |
| Comparative sample 1 | TiN | 0.2 | TiCN | 6.0 | TiCNO | 0.3 | 6.5 | Al₂O₃ | α | 9.0 | TiCN | 2.0 | 17.5 |
| Comparative sample 2 | TiN | 0.2 | TiCN | 6.0 | TiCNO | 0.3 | 6.5 | Al₂O₃ | α | 9.0 | TiCN | 2.0 | 17.5 |
| Comparative sample 3 | TiN | 0.2 | TiCN | 15.0 | TiCNO | 0.3 | 15.5 | Al₂O₃ | α | 14.5 | TiCN | 2.0 | 32.0 |
| Comparative sample 4 | TiN | 0.2 | TiCN | 6.0 | TiCNO | 0.3 | 6.5 | Al₂O₃ | α | 9.0 | TiN | 2.0 | 17.5 |
| Comparative sample 5 | TiN | 0.2 | TiCN | 6.0 | TiCNO | 0.3 | 6.5 | Al₂O₃ | α | 9.0 | TiCN | 8.0 | 23.5 |
| Comparative sample 6 | TiN | 0.2 | TiCN | 6.0 | TiCNO | 0.3 | 6.5 | Al₂O₃ | α | 5.0 | TiCN | 4.0 | 15.5 |
| Comparative sample 7 | TiN | 0.2 | TiCN | 6.0 | TiCNO | 0.3 | 6.5 | Al₂O₃ | α | 5.0 | TiCN | 4.0 | 15.5 |
| Comparative sample 8 | TiN | 0.2 | TiCN | 6.0 | TiCNO | 0.3 | 6.5 | Al₂O₃ | α | 9.0 | TiCN | 2.0 | 17.5 |

TABLE 3

| | Upper layer | | | | | | |
|---|---|---|---|---|---|---|---|
| | Temperature (° C.) | Pressure (hPa) | Raw material composition (mol %) | | | | TiCl₄/CH₃CN |
| | | | TiCl₄ | CH₃CN | CH₄ | N₂ | H₂ | |
| Invention sample 1 | 950 | 70 | 8.0 | 1.0 | 0.0 | 15.0 | 76.0 | 8.0 |
| Invention sample 2 | 950 | 70 | 8.0 | 1.0 | 0.0 | 10.0 | 81.0 | 8.0 |
| Invention sample 3 | 900 | 70 | 10.0 | 0.8 | 0.0 | 15.0 | 74.2 | 12.5 |
| Invention sample 4 | 980 | 70 | 8.0 | 1.0 | 0.0 | 15.0 | 76.0 | 8.0 |
| Invention sample 5 | 950 | 70 | 8.0 | 1.0 | 0.0 | 30.0 | 61.0 | 8.0 |
| Invention sample 6 | 900 | 70 | 9.0 | 1.0 | 0.0 | 15.0 | 75.0 | 9.0 |
| Invention sample 7 | 900 | 70 | 9.0 | 1.0 | 0.0 | 15.0 | 75.0 | 9.0 |
| Invention sample 8 | 950 | 70 | 9.0 | 1.0 | 0.0 | 30.0 | 60.0 | 9.0 |
| Invention sample 9 | 950 | 70 | 8.0 | 1.0 | 0.0 | 10.0 | 81.0 | 8.0 |

TABLE 3-continued

|  | Upper layer | | | | | | | |
|---|---|---|---|---|---|---|---|---|
|  | Temperature (° C.) | Pressure (hPa) | Raw material composition (mol %) | | | | | TiCl$_4$/ CH$_3$CN |
|  |  |  | TiCl$_4$ | CH$_3$CN | CH$_4$ | N$_2$ | H$_2$ |  |
| Invention sample 10 | 950 | 70 | 6.0 | 0.5 | 0.0 | 10.0 | 83.5 | 12.0 |
| Invention sample 11 | 950 | 70 | 9.0 | 1.5 | 0.0 | 15.0 | 74.5 | 6.0 |
| Invention sample 12 | 950 | 70 | 8.0 | 1.0 | 0.0 | 30.0 | 61.0 | 8.0 |
| Comparative sample 1 | 1050 | 70 | 8.0 | 0.0 | 1.5 | 5.0 | 85.5 | — |
| Comparative sample 2 | 950 | 150 | 8.0 | 1.0 | 0.0 | 0.0 | 91.0 | 8.0 |
| Comparative sample 3 | 950 | 70 | 9.0 | 1.0 | 0.0 | 30.0 | 60.0 | 9.0 |
| Comparative sample 4 | 950 | 70 | 6.0 | 0.0 | 0.0 | 30.0 | 64.0 | — |
| Comparative sample 5 | 900 | 70 | 9.0 | 1.0 | 0.0 | 15.0 | 75.0 | 9.0 |
| Comparative sample 6 | 950 | 200 | 8.0 | 0.0 | 1.5 | 5.0 | 85.5 | — |
| Comparative sample 7 | 1000 | 70 | 8.0 | 1.0 | 1.5 | 5.0 | 84.5 | 8.0 |
| Comparative sample 8 | 1000 | 70 | 8.0 | 1.0 | 1.5 | 5.0 | 84.5 | 8.0 |

Average Thickness of Each Layer

The average thickness of each of the layers of each of the obtained samples was obtained as set forth below. That is, using an FE-SEM, such average thickness was obtained by: measuring the thickness of each layer at each of the three locations from the cross-sectional surface near the position 50 μm from the edge of the coated cutting tool, toward the center of the rake surface thereof; and calculating the arithmetic mean of the resulting measurements. The measurement results are shown in Table 2.

Composition of Each Layer

Using an EDS, the composition of each layer of each of the obtained samples was measured from the cross-sectional surface near the position at most 50 μm from the edge of the coated cutting tool, toward the center of the rake surface thereof. The measurement results are shown in Table 2.

Ratio of Area X

In the obtained sample, the ratio of grains having an aspect ratio of 2 or more and 10 or less among the grains of the TiCN layer constituting the upper layer was measured using an EBSD incorporated in the FE-SEM. Specifically, the cross section of the upper layer having the TiCN layer among the cross sections perpendicular to the surface of the substrate in the sample was mirror-polished using diamond paste, and then finish polished using colloidal silica, and the obtained mirror-polished surface was taken as the cross-sectional structure of the coated cutting tool. The sample having the cross-sectional structure of the coated cutting tool was set in the FE-SEM, and the cross-sectional structure of the sample was irradiated with an electron beam with an acceleration voltage of 15 kV and an irradiation current of 1.0 nA at an incident angle of 70 degrees. The cross-sectional structure in the upper layer having the TiCN layer of the coated cutting tool was measured by EBSD in the measurement range of the average thickness of the upper layer having the TiCN layer×50 μm and the step size of 0.1 μm. At this time, a boundary having a misorientation of 5° or more was regarded as a crystal grain boundary, and a region surrounded by the crystal grain boundary was taken as a grain. Here, the crystal grain size meant a crystal grain size in a direction perpendicular to the film thickness direction of the coating layer. The aspect ratio was obtained by dividing the crystal grain size of the grain in the film thickness direction of the coating layer by the crystal grain size of the grain in the direction perpendicular to the film thickness direction. At this time, image analysis software was used when obtaining the crystal grain size from the cross-sectional structure of the upper layer having the TiCN layer. The crystal grain size of the upper layer having the TiCN layer in the range of the average thickness of the upper layer having the TiCN layer×50 μm was measured, and the aspect ratio of all the grains was obtained from the crystal grain size in each direction. Here, assuming that the range of the average thickness of the upper layer having the TiCN layer×50 μm was 100 area %, the ratio of the area occupied by the TiCN grains having an aspect ratio of 2 or more and 10 or less was calculated. The results are shown in Table 4.

RSA$_1$, RSA$_2$, RSA$_3$, and RSA$_4$

RSA$_1$, RSA$_2$, RSA$_3$, and RSA$_4$ in the obtained samples were calculated by the following method. Specifically, in the grains having an aspect ratio of 2 or more and 10 or less among the grains of the TiCN layer constituting the upper layer, the sum (RSA$_{Total}$) of the areas of the cross sections of the grains having a misorientation A of the angle formed between the normal to the surface of the substrate and the normal to the (111) orientation of the grains of the TiCN layer in the upper layer of 0° or more and 45° or less, the cross sections being perpendicular to the surface of the substrate in the sample, was taken as 100 area %, a ratio (area %) of the sum of the areas of the cross sections of the grains having a misorientation A of 0 degrees or more and 10 degrees or less to the RSA$_{Total}$ was determined and this ratio was taken as the RSA$_1$. When obtaining the RSA (area %), the cross-sectional area of each grain was measured using an EBSD incorporated in FE-SEM. With the EBSD, the crystal orientation of each crystal of the grains was specified, the cross-sectional area of the grain with specified crystal orientation is classified into one of the divisions in, for example, respective 5-degree pitches, and the cross-sectional areas of the grains in each division were obtained.

Thereafter, the sum of the cross-sectional areas of grains was obtained for each division among a division of 0 degrees or more and less than 10 degrees, a division of 10 degrees or more and less than 20 degrees, a division of 20 degrees or more and less than 30 degrees, and a division of 30 degrees or more to 45 degrees or less, a ratio of the cross-sectional areas of grains for each of the divisions to the $RSA_{Total}$ (100 area %) was obtained, and the resulting ratios were taken as $RSA_1$, $RSA_2$, $RSA_3$, and $RSA_4$ in the above order. The above measurement results are shown in Table 4. In addition, the cross-sectional area of the grains of the upper layer within the measurement range by EBSD was taken as the sum total of pixels corresponding to the area. That is, the sum of the cross-sectional areas of grains in each division for each 10-degree or 15-degree pitch based on the misorientation of the grains in each layer was determined by summing up the pixels occupied by the grain cross-section corresponding to each division and converting the sum to the area.

Cutting tests 1 and 2 were conducted using the obtained samples, i.e., invention samples 1 to 12 and comparative samples 1 to 8, under the following conditions. Cutting test 1 is a wear test for evaluating wear resistance, and cutting test 2 is a fracture test for evaluating fracture resistance. The results of the respective cutting tests are shown in Table 5.

Cutting Test 1
Workpiece material: S45C round bar,
Cutting speed: 200 m/min,
Feed: 0.30 mm/rev,
Depth of cut: 2.0 mm
Coolant: used,
Evaluation items: a time when the sample was fractured or had a maximum flank wear width of 0.3 mm was defined as the end of the tool life, and the machining time to reach the end of the tool life was measured.

Cutting Test 2
Workpiece material: S45C round bar with four grooves
Cutting speed: 120 m/min,
Feed: 0.30 mm/rev,
Depth of cut: 1.5 mm,
Coolant: Used,
Evaluation items: a time when the sample was fractured or had a maximum flank wear width of 0.3 mm was defined as the end of the tool life, and the machining time to reach the end of the tool life was measured, and the number of shocks

TABLE 4

| | Upper layer | | | | |
|---|---|---|---|---|---|
| | Ratio of grains | $RSA_{Total}$ (100 area %) | | | |
| Sample number | with an aspect ratio of 2 or more and 10 or less (area %) | $RSA_1$ 0 degrees or more and less than 10 degrees | $RSA_2$ 10 degrees or more and less than 20 degrees | $RSA_3$ 20 degrees or more and less than 30 degrees | $RSA_4$ 30 degrees or more and 45 degrees or less |
| Invention sample 1 | 79 | 70 | 3 | 3 | 24 |
| Invention sample 2 | 72 | 41 | 8 | 24 | 27 |
| Invention sample 3 | 89 | 52 | 20 | 10 | 18 |
| Invention sample 4 | 60 | 73 | 8 | 6 | 13 |
| Invention sample 5 | 68 | 85 | 3 | 1 | 11 |
| Invention sample 6 | 88 | 63 | 13 | 9 | 15 |
| Invention sample 7 | 92 | 77 | 6 | 3 | 14 |
| Invention sample 8 | 85 | 82 | 6 | 2 | 10 |
| Invention sample 9 | 80 | 42 | 26 | 15 | 17 |
| Invention sample 10 | 85 | 40 | 23 | 16 | 21 |
| Invention sample 11 | 64 | 47 | 19 | 15 | 19 |
| Invention sample 12 | 71 | 88 | 2 | 1 | 9 |
| Comparative sample 1 | 51 | 68 | 12 | 10 | 10 |
| Comparative sample 2 | 70 | 28 | 30 | 25 | 17 |
| Comparative sample 3 | 86 | 80 | 5 | 3 | 12 |
| Comparative sample 4 | 28 | 45 | 14 | 15 | 26 |
| Comparative sample 5 | 90 | 75 | 6 | 4 | 15 |
| Comparative sample 6 | 43 | 56 | 18 | 10 | 16 |
| Comparative sample 7 | 75 | 32 | 26 | 15 | 27 |
| Comparative sample 8 | 72 | 25 | 15 | 18 | 42 | applied until the end of the tool life was measured. Further, the damage state when the number of shocks reached 5000 shocks was checked with an SEM. The number of shocks was set up to 15,000.

As to the machining time to reach the end of the tool life in cutting test 1 (wear test), evaluations were made with grade "A" for 41 minutes or more, grade "B" for 30 minutes or more and less than 41 minutes, and grade "C" for less than 30 minutes. Further, as to the number of shocks until the end of the tool life in cutting test 2 (fracture test), evaluations were made with grade "A" for 13,000 or more, grade "B" for 11,000 or more and 12,999 or less, and grade "C" for 10,999 or less. In such evaluations, "A" refers to excellent, "B" refers to good and "C" refers to inferior, meaning that a sample involving a larger number of "A"s or "B"s has more excellent cutting performance. The evaluation results are shown in Table 5.

TABLE 5

|  | Cutting test 1 | | Cutting test 2 | | |
| --- | --- | --- | --- | --- | --- |
|  | Machining time (min) | Grade | Damage state at 5000 shocks | Number of shocks (shocks) | Grade |
| Invention sample 1 | 41 | A | Normal wear | 14000 | A |
| Invention sample 2 | 33 | B | Normal wear | 14800 | A |
| Invention sample 3 | 37 | B | Normal wear | 13800 | A |
| Invention sample 4 | 36 | B | Normal wear | 13600 | A |
| Invention sample 5 | 42 | A | Normal wear | 14200 | A |
| Invention sample 6 | 36 | B | Normal wear | 12800 | B |
| Invention sample 7 | 38 | B | Normal wear | 12200 | B |
| Invention sample 8 | 42 | A | Normal wear | 14400 | A |
| Invention sample 9 | 34 | B | Normal wear | 14800 | A |
| Invention sample 10 | 33 | B | Normal wear | 14600 | A |
| Invention sample 11 | 30 | B | Normal wear | 15000 | A |
| Invention sample 12 | 44 | A | Normal wear | 11400 | B |
| Comparative sample 1 | 22 | C | Chipping | 12400 | B |
| Comparative sample 2 | 18 | C | Normal wear | 14200 | A |
| Comparative sample 3 | 42 | A | — | 4000 | C |
| Comparative sample 4 | 27 | C | Chipping | 10000 | C |
| Comparative sample 5 | 43 | A | Chipping | 6000 | C |
| Comparative sample 6 | 22 | C | Normal wear | 13400 | A |
| Comparative sample 7 | 14 | C | Normal wear | 13800 | A |
| Comparative sample 8 | 20 | C | Normal wear | 12000 | B |

* In the cutting test 2, Comparative sample 3 was chipped at 4000 shocks

The results in Table 5 show that each invention sample had grade "A" or "B" in both the wear test and the fracture test. Meanwhile, as to the evaluations made on the comparative samples, each comparative sample had grade "C" in either or both of the wear test and the fracture test.

It is apparent from the above results that each invention sample has excellent wear resistance and fracture resistance, thereby resulting in a longer tool life.

INDUSTRIAL APPLICABILITY

The coated cutting tool according to the present invention has excellent wear resistance while not involving a reduction in fracture resistance so that the tool life can be extended more than that involved in the prior art, and from such perspective, the coated cutting tool has industrial applicability.

REFERENCE SIGNS LIST

1: Substrate, 2: Lower layer, 3: Intermediate layer, 4: Upper layer, 5: Coating layer, 6: Coated cutting tool.

What is claimed is:

1. A coated cutting tool comprising: a substrate; and a coating layer formed on a surface of the substrate, wherein:
the coating layer comprises a lower layer, an intermediate layer and an upper layer in this order from the substrate side;
the lower layer comprises one or more Ti compound layers containing a Ti compound of Ti and an element of at least one kind selected from the group consisting of C, N, O and B; and the intermediate layer comprises an $\alpha$-$Al_2O_3$ layer containing $\alpha$-$Al_2O_3$; and the upper layer comprises a TiCN layer containing TiCN;
an average thickness of the coating layer is 5.0 μm or more and 30.0 μm or less, and an average thickness of the upper layer is 1.0 μm or more and 6.0 μm or less;
in a cross section perpendicular to the surface of the substrate, a ratio of grains having an aspect ratio of 2 or more and 10 or less among the grains in the TiCN layer constituting the upper layer is 60 area % or more and 95 area % or less; and
in the grains having an aspect ratio of 2 or more and 10 or less among the grains in the TiCN layer constituting the upper layer, a misorientation A satisfies a condition represented by a following formula (1):

$$40 \leq RSA_1 \leq 90 \quad (1)$$

in the formula, $RSA_1$ is a ratio, in terms of area %, of a cross-sectional area of grains having a misorientation A of 0 degrees or more and less than 10 degrees to a cross-sectional area of grains having a misorientation A of 0 degrees or more and 45 degrees or less, and the misorientation A is an angle, in terms of degrees, formed by a normal to the surface of the substrate and a normal to a (111) orientation of the grain of the TiCN layer in the upper layer.

2. The coated cutting tool according to claim 1, wherein the $RSA_1$ is 60 area % or more and 90 area % or less.

3. The coated cutting tool according to claim 1, wherein where a ratio of a cross-sectional area of grains having a misorientation A of 0 degrees or more and less than 10 degrees, a ratio of a cross-sectional area of grains having a misorientation A of 10 degree or more and less than 20 degrees, a ratio of a cross-sectional area of grains having a misorientation A of 20 degree or more and less than 30 degrees, and a ratio of a cross-sectional area of grains having a misorientation A of 30 degree or more and 45 degrees or less to a cross-sectional area of grains having a misorientation A of 0 degrees or more and 45 degrees or less is denoted by $RSA_1$, $RSA_2$, $RSA_3$, and $RSA_4$, respectively, the $RSA_1$ is the largest and the $RSA_4$ is the second largest among the $RSA_1$, $RSA_2$, $RSA_3$, and $RSA_4$.

4. The coated cutting tool according to claim 1, wherein an average thickness of the intermediate layer is 3.0 μm or more and 15.0 μm or less.

5. The coated cutting tool according to claim 1, wherein an average thickness of the lower layer is 3.0 μm or more and 15.0 μm or less.

6. The coated cutting tool according to claim 1, wherein the lower layer comprises at least one layer selected from the group consisting of a TiN layer containing TiN, a TiC layer containing TiC, a TiCN layer containing TiCN, a TiCNO layer containing TiCNO, a TiON layer containing TiON, and a $TiB_2$ layer containing $TiB_2$.

7. The coated cutting tool according to claim 1, wherein the substrate is any one of cemented carbide, cermet, ceramic, or cubic boron nitride sintered body.

8. The coated cutting tool according to claim 2, wherein where a ratio of a cross-sectional area of grains having a misorientation A of 0 degrees or more and less than 10 degrees, a ratio of a cross-sectional area of grains having a misorientation A of 10 degree or more and less than 20 degrees, a ratio of a cross-sectional area of grains having a misorientation A of 20 degree or more and less than 30 degrees, and a ratio of a cross-sectional area of grains having a misorientation A of 30 degree or more and 45 degrees or less to a cross-sectional area of grains having a misorientation A of 0 degrees or more and 45 degrees or less is denoted by $RSA_1$, $RSA_2$, $RSA_3$, and $RSA_4$, respectively, the $RSA_1$ is the largest and the $RSA_4$ is the second largest among the $RSA_1$, $RSA_2$, $RSA_3$, and $RSA_4$.

9. The coated cutting tool according to claim 2, wherein an average thickness of the intermediate layer is 3.0 μm or more and 15.0 μm or less.

10. The coated cutting tool according to claim 3, wherein an average thickness of the intermediate layer is 3.0 μm or more and 15.0 μm or less.

11. The coated cutting tool according to claim 8, wherein an average thickness of the intermediate layer is 3.0 μm or more and 15.0 μm or less.

12. The coated cutting tool according to claim 2, wherein an average thickness of the lower layer is 3.0 μm or more and 15.0 μm or less.

13. The coated cutting tool according to claim 3, wherein an average thickness of the lower layer is 3.0 μm or more and 15.0 μm or less.

14. The coated cutting tool according to claim 4, wherein an average thickness of the lower layer is 3.0 μm or more and 15.0 μm or less.

15. The coated cutting tool according to claim 8, wherein an average thickness of the lower layer is 3.0 μm or more and 15.0 μm or less.

16. The coated cutting tool according to claim 9, wherein an average thickness of the lower layer is 3.0 μm or more and 15.0 μm or less.

17. The coated cutting tool according to claim 10, wherein an average thickness of the lower layer is 3.0 μm or more and 15.0 μm or less.

18. The coated cutting tool according to claim 11, wherein an average thickness of the lower layer is 3.0 μm or more and 15.0 μm or less.

19. The coated cutting tool according to claim 2, wherein the lower layer comprises at least one layer selected from the group consisting of a TiN layer containing TiN, a TiC layer containing TiC, a TiCN layer containing TiCN, a TiCNO layer containing TiCNO, a TiON layer containing TiON, and a $TiB_2$ layer containing $TiB_2$.

20. The coated cutting tool according to claim 3, wherein the lower layer comprises at least one layer selected from the group consisting of a TiN layer containing TiN, a TiC layer containing TiC, a TiCN layer containing TiCN, a TiCNO layer containing TiCNO, a TiON layer containing TiON, and a $TiB_2$ layer containing $TiB_2$.

* * * * *